United States Patent
Abe et al.

(10) Patent No.: US 11,862,671 B2
(45) Date of Patent: Jan. 2, 2024

(54) SEMICONDUCTOR DEVICE (71) Applicant: Sharp Fukuyama Laser Co., Ltd., Fukuyama (JP)

(72) Inventors: Haruki Abe, Fukuyama (JP); Ryu Kaihara, Fukuyama (JP); Takahiro Takimoto, Fukuyama (JP)

(73) Assignee: Sharp Fukuyama Laser Co., Ltd., Fukuyama (JP)

( * ) Notice: Subject to any disclaimer, the term of this patent is extended or adjusted under 35 U.S.C. 154(b) by 73 days.

(21) Appl. No.: 17/890,277

(22) Filed: Aug. 18, 2022

(65) Prior Publication Data
US 2023/0091522 A1  Mar. 23, 2023

(30) Foreign Application Priority Data
Sep. 17, 2021  (JP) .................. 2021-152059

(51) Int. Cl.
*H01L 29/06*  (2006.01)
*H01L 29/78*  (2006.01)

(52) U.S. Cl.
CPC ...... *H01L 29/0607* (2013.01); *H01L 29/7816* (2013.01)

(58) Field of Classification Search
CPC .......... H01L 29/66674–66734; H01L 29/7801–7826; H01L 29/04–045; H01L 29/16–1608; H01L 29/18–185; H01L 29/22–2206; H01L 29/36–365; H01L 29/0856–0869; H01L 29/0873–0886; H01L 29/66681–66704; H01L 29/7816–7826; H01L 29/66696; H01L 29/66727; H01L 29/41741; H01L 29/783; H01L 29/0607; H01L 29/66545; H01L 21/76846; H01L 21/76849; H01L 29/7845; H01L 21/76834; H01L 29/41791; H01L 21/76801; H01L 21/0337; H01L 21/28247; H01L 21/28568; H01L 21/3086; H01L 21/31105; H01L 21/31144; H01L 21/76224; H01L 21/823481; H01L 21/823807; H01L 21/823814; H01L 21/823821; H01L 21/823842; H01L 21/823857; H01L 21/823871; H01L 21/823878; H01L 23/5283;
(Continued)

(56) References Cited

U.S. PATENT DOCUMENTS

2009/0184370 A1* 7/2009 Taki ................. H01L 29/66681
                                                                 438/510

FOREIGN PATENT DOCUMENTS

JP  2009-059949 A  3/2009

* cited by examiner

*Primary Examiner* — Moin M Rahman
(74) *Attorney, Agent, or Firm* — ScienBiziP, P.C.

(57) ABSTRACT

A semiconductor device includes a semiconductor substrate of a first conductivity type, a body region of the first conductivity type, a source region of a second conductivity type, a drain region of the second conductivity type, a gate electrode, a drift region of the second conductivity type, an implanted oxide layer, and a semiconductor region of the first conductivity type. The semiconductor region is formed to extend in a direction along the top face of the semiconductor substrate. A first distance and a second distance are set so that an intensity of 0.35 MV/cm or less is observed in an electric field of a first region including the end portion of the drift region and in an electric field of a second region between the end of the semiconductor region and the drain region.

3 Claims, 5 Drawing Sheets

1: SEMICONDUCTOR DEVICE
2: P-TYPE SEMICONDUCTOR SUBSTRATE
2a: TOP FACE
3: P-TYPE DIFFUSION REGION
4: P-TYPE BODY REGION
5: N-TYPE DRIFT REGION
5a: END PORTION
6: N-TYPE SOURCE REGION
6a: SOURCE ELECTRODE
7: P-TYPE BODY CONTACT REGION
8: N-TYPE DRAIN REGION
8a: DRAIN ELECTRODE
9: GATE ELECTRODE
10: GATE INSULATING FILM
11: THICK OXIDE FILM
12: STI STRUCTURE
P1: FIRST REFERENCE POSITION
P2: SECOND REFERENCE POSITION (58) Field of Classification Search
CPC ........... H01L 23/53266; H01L 27/0924; H01L 27/1104; H01L 28/24; H01L 29/0847; H01L 29/516; H01L 29/6653; H01L 29/7854; H01L 21/28518; H01L 23/5329; H01L 27/0207; H01L 28/20; H01L 29/41783; H01L 21/02532; H01L 21/02636; H01L 21/76802; H01L 21/76877; H01L 21/823828; H01L 23/528; H01L 27/0922; H01L 29/167; H01L 29/66636; H01L 29/7851; H01L 29/66795; H01L 29/7846; H01L 29/785; H01L 29/165; H01L 21/76897; H01L 23/5226; H01L 23/53209; H01L 23/53238; H01L 21/76816; H01L 29/0649; H01L 29/66818; H01L 29/7848; H01L 29/7843; H01L 27/0886; H01L 21/76232; H01L 29/6656; H01L 29/0653; H01L 21/823431; H01L 21/76883; H01L 21/76885; H01L 29/665; H01L 21/02164; H01L 21/0217; H01L 21/0332; H01L 21/823437; H01L 21/823475; H01L 24/16; H01L 29/7842; H01L 29/7853; H01L 2224/16227; H01L 24/32; H01L 24/73; H01L 2224/32225; H01L 2224/73204; H01L 23/48

See application file for complete search history.

FIG. 1

| | |
|---|---|
| 1: SEMICONDUCTOR DEVICE | 7: P-TYPE BODY CONTACT REGION |
| 2: P-TYPE SEMICONDUCTOR SUBSTRATE | 8: N-TYPE DRAIN REGION |
| 2a: TOP FACE | 8a: DRAIN ELECTRODE |
| 3: P-TYPE DIFFUSION REGION | 9: GATE ELECTRODE |
| 4: P-TYPE BODY REGION | 10: GATE INSULATING FILM |
| 5: N-TYPE DRIFT REGION | 11: THICK OXIDE FILM |
| 5a: END PORTION | 12: STI STRUCTURE |
| 6: N-TYPE SOURCE REGION | P1: FIRST REFERENCE POSITION |
| 6a: SOURCE ELECTRODE | P2: SECOND REFERENCE POSITION |

SEMICONDUCTOR DEVICE

CROSS-REFERENCE TO RELATED APPLICATION

The present application claims priority from Japanese Application Number 2021-152059, the content to which is hereby incorporated by reference into this application.

BACKGROUND OF THE INVENTION

1. Field of the Invention

An aspect of the present invention relates to a high breakdown-voltage transistor such as a laterally diffused MOS (LDMOS).

2. Description of the Related Art

High breakdown-voltage metal oxide semiconductor field effect transistors (MOSFETs) include various kinds of known MOSFETs. For example, LDMOS transistors are devices that achieves high breakdown-voltage and low ON-resistance. The LDMOS transistors have such features as fast switching speed, and superior usability since the LDMOS transistors are driven by voltage. Hence, utilizing such features, the LDMOS transistors are used for, for example, switching regulators, various kinds of drivers, and DC-DC converters, playing a key role in the fields where power and high breakdown-voltage are required.

Thus, an LDMOS transistor is required to have characteristics to ensure a high breakdown-voltage when the transistor is OFF and achieve a low ON-resistance to reduce a loss when the transistor is in conduction. However, typically, there is a trade-off between the breakdown-voltage and the ON-resistance. The higher the breakdown voltage is, the higher the ON-resistance is. Hence, developments have been conducted for years on how to achieve both the high breakdown-voltage and the low ON-resistance.

The LDMOS transistor is structured to have the drain region laterally extended in order to alleviate concentration of an electric field between the drain and the gate, and an electric field between the source and the drain. When the LDMOS is used with a large current, a high voltage is applied to the drain region. That is why an electric field is likely to concentrate on an end of the gate toward the drain and on a joint portion between the source and the drain. Alleviating such concentration of the electric fields is a useful technique to enhance the breakdown voltage of the transistor.

For example, the Japanese Unexamined Patent Application Publication No. 2009-059949 describes an N-type LDMOS transistor formed in an N-type diffusion region. In the transistor, a P-type diffusion region is disposed below a P-type body region. This structure alleviates concentration of an electric field in a region where the gate electrode overlaps a LOCOS oxide film. As a result, the LDMOS transistor can have a higher breakdown-voltage.

SUMMARY OF THE INVENTION

As to the structure of the LDMOS transistor disclosed in the Japanese Unexamined Patent Application Publication No. 2009-059949, if the P-type diffusion region is extended and disposed below an N-type drift region, there is an increase in intensity of an electric field between the P-type diffusion region and an N-type drain region. The resulting problem is avalanche breakdown and the following decrease in breakdown voltage.

An aspect of the present invention is intended to provide a semiconductor device capable of increasing a breakdown-voltage of an LDMOS transistor, and readily avoiding reduction in breakdown-voltage caused by avalanche breakdown.

In order to solve the above problem, a semiconductor device according to an aspect of the present invention includes: a semiconductor substrate of a first conductivity type; a body region of the first conductivity type, the body region being formed in a surface layer of the semiconductor substrate; a source region of a second conductivity type, the source region being formed in contact with the body region; a drain region of the second conductivity type, the drain region being formed away from the body region; a gate electrode formed between the source region and the drain region; a drift region of the second conductivity type, the drift region being formed in contact with the drain region in the surface layer of the semiconductor substrate, and the drift region having an end portion between the body region and the drain region; a buried oxide layer provided at least under an end portion, of the gate electrode, toward the drain region, the buried oxide layer being formed to be buried from a top face of the semiconductor substrate, and the buried oxide layer being configured to alleviate an electric field; and a semiconductor region of the first conductivity type, the semiconductor region being formed in a position deeper than the body region in order to have contact with a bottom face of the body region, wherein, the semiconductor region is formed to extend in a direction along the top face of the semiconductor substrate, a first distance is in a direction from a first reference position below an end, of the body region, toward the drain region to an end of the semiconductor region, the first distance being along the top face of the semiconductor substrate, a second distance is in a direction from a second reference position below an end, of the drain region, toward the buried oxide layer to the end of the semiconductor region, the second distance being along the top face of the semiconductor substrate, and the first distance and the second distance are set so that an intensity of 0.35 MV/cm or less is observed in an electric field of a first region including the end portion of the drift region and in an electric field of a second region between the end of the semiconductor region and the drain region.

An aspect of the present invention can increase a breakdown-voltage of an LDMOS transistor, and readily avoid reduction in breakdown-voltage caused by avalanche breakdown.

DETAILED DESCRIPTION OF THE INVENTION (Structure of Semiconductor Device 1)

An embodiment of the present invention is described below in detail, with reference to FIGS. 1 to 5.

Figure 1:
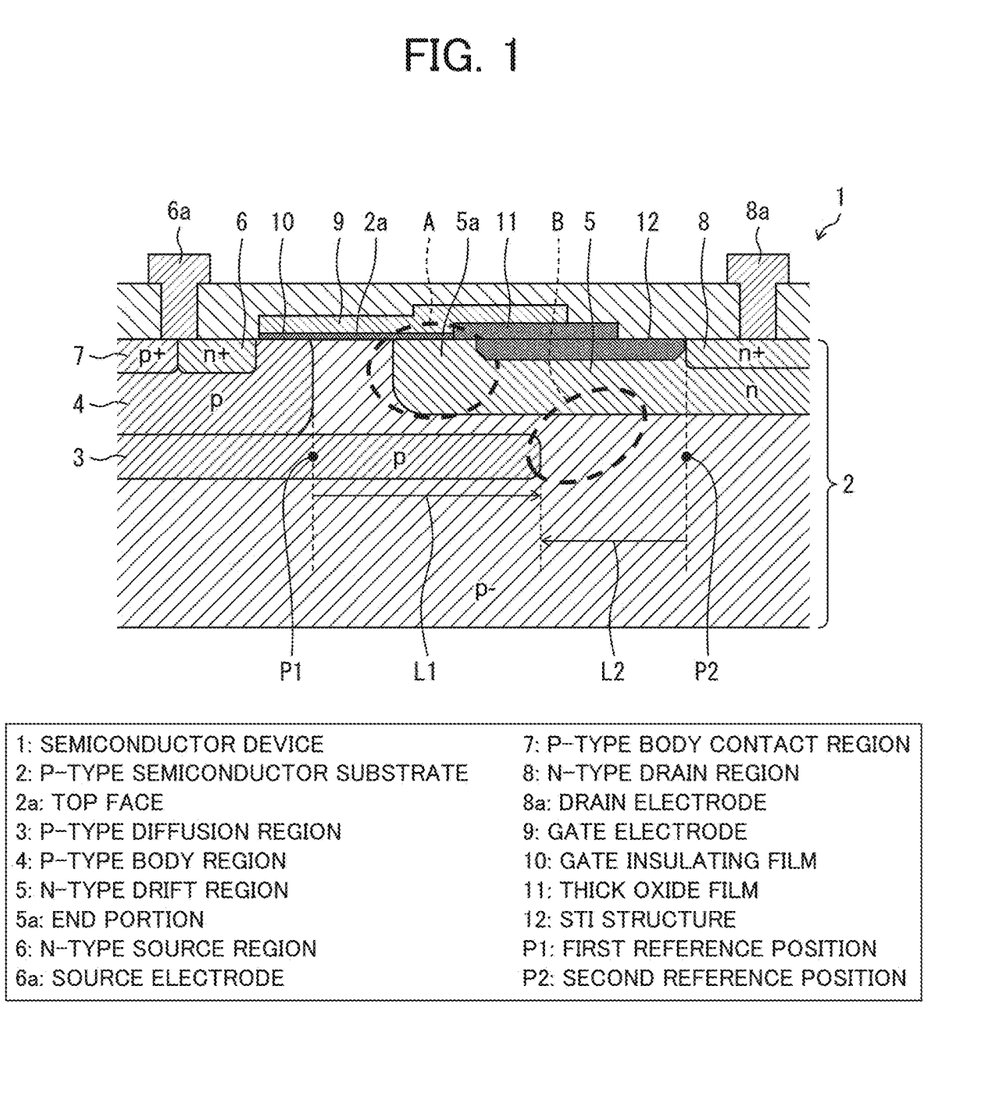
FIG. 1 is a vertical cross-sectional view of a cross-sectional structure of a semiconductor device according to an embodiment of the present invention.

FIG. 1 is a vertical cross-sectional view of a cross-sectional structure of a semiconductor device 1 according to this embodiment.

In this embodiment, the semiconductor device 1 is an N-channel laterally-diffused MOS (LDMOS) transistor for a breakdown voltage of 60 V.

As illustrated in FIG. 1, the semiconductor device 1 includes: a P-type semiconductor substrate 2 (a semiconductor substrate); a P-type diffusion region 3 (a semiconductor region); a P-type body region 4 (a body region); an N-type drift region 5 (a drift region); an N-type source region 6 (a source region); a source electrode 6a; a P-type body contact region 7; an N-type drain region 8 (a drain region); a drain electrode 8a; a gate electrode 9; a gate insulating film 10; a thick oxide film 11; and a shallow trench isolation (STI) structure 12.

Note that, in FIG. 1, a layer denoted with "p" contains a P-type impurity, and a layer denoted with "n" contains an N-type impurity. Moreover, a layer denoted with "p$^+$" contains a P-type impurity higher in concentration than the P-type impurity of the layer denoted with "p". A layer denoted with "n$^+$" contains an N-type impurity higher in concentration than the N-type impurity of the layer denoted with "n".

The P-type body region 4 is of the P-type (a first conductivity type). The P-type body region 4 is formed in a surface layer of the P-type semiconductor substrate 2, with, for example, boron ions (11B$^+$) implanted into the surface layer for several times at different acceleration energies (60 to 500 keV). A dose of the ions to be implanted ranges from 1.0E12 to 1.0E13/cm$^2$. The P-type body region 4 is formed to have a portion exposed to a top face 2a of the P-type semiconductor substrate 2.

The P-type diffusion region 3 is of the P-type. The P-type diffusion region 3 has a top face positioned deep in the P-type semiconductor substrate 2 so that the top face is in contact with a bottom face of the P-type body region 4. The P-type diffusion region 3 is formed to extend, along the top face 2a of the P-type semiconductor substrate 2, from below the P-type body region 4 over an area below any of the gate insulating film 10, the thick oxide film 11, and the STI structure 12 to be described later. The P-type diffusion region 3 is formed with, for example, boron ions (11B$^+$) implanted therein at an acceleration energy of 500 to 5000 keV. A dose of the ions to be implanted ranges from 5.0E11 to 5.0E12/cm$^2$.

The N-type source region 6 is of the N-type (a second conductivity type). The N-type source region 6 in the surface layer of the P-type semiconductor substrate 2 is formed above, and in contact with, the P-type body region 4. The N-type source region 6 is also exposed to the top face 2a of the P-type semiconductor substrate 2. The N-type source region 6 is formed with, for example, phosphorus ions (31P$^+$) implanted therein at an acceleration energy of 35 to 60 KeV.

The P-type body contact region 7 is of the P-type. The P-type body contact region 7 in the surface layer of the P-type semiconductor substrate 2 is formed above, and in contact with, the P-type body region 4. The P-type body contact region 7 is also exposed to the top face 2a of the P-type semiconductor substrate 2. The P-type body contact region 7 is adjacent to, and in contact with, the N-type source region 6. The P-type source region 7 is formed with, for example, boron ions (31P$^+$) implanted therein at an acceleration energy of 5 to 30 KeV.

The source electrode 6a is formed on the N-type source region 6 and the P-type body contact region 7.

The N-type drift region 5 is of the N-type. The N-type drift region 5 is disposed in the surface layer of the P-type semiconductor substrate 2, and positioned closer to the top face 2a of the semiconductor substrate than to the P-type diffusion region 3. The N-type drift region 5 is formed in contact with the N-type drain region 8. The N-type drift region 5 includes an end portion 5a positioned between the P-type body region 4 and the N-type drain region 8. The end portion 5a has a top face exposed to the top face 2a of the P-type semiconductor substrate 2. Such a structure of the N-type drift region 5 can avoid contact between the P-type diffusion region 3 and the N-type drift region 5, both of which are high in impurity concentration.

Moreover, the N-type drift region 5 is lower in impurity concentration than the N-type drain region 8. The N-type drift region 5 is formed with, for example, phosphorus ions (31P$^+$) implanted therein for several times at different acceleration energies (140 to 540 keV). A dose of the ions to be implanted ranges from 7.5E11 to 3.5E12/cm$^2$.

Note that, in the implantations of the ions to form the N-type drift region 5 and the P-type diffusion region 3, the acceleration energies for the respective implantations are adjusted so that the N-type drift region 5 avoids contact with the P-type diffusion region 3 in the depth direction.

The N-type drain region 8 is of the N-type. The N-type drain region 8 in the surface layer of the P-type semiconductor substrate 2 is disposed away from the P-type body region 4. The N-type drain region 8 is formed simultaneously with the N-type source region 6.

The drain electrode 8a is formed on the N-type drain region 8.

The gate insulating film 10 is formed in an area including: the top face 2a of the P-type semiconductor substrate 2; a top face of the P-type body region 4; and a top face of the end portion of the N-type drift region 5. The gate insulating film 10 is not formed on the top faces of: the N-type source region 6; the P-type body contact region 7; the N-type drain region 8; or the STI structure 12.

The thick oxide film 11 is an oxide film formed thickly on the top face of the N-type drift region 5 to extend from an end, of the gate insulating film 10, closer to the N-type drain region 8 toward the N-type drain region 8. The thick oxide film 11 to be suitably used includes, for example, a local-oxidation-of-silicon (LOCOS) oxide film to be formed by thermal oxidation, or an oxide film (a high temperature oxidation (HTO) film) to be formed by high-temperature oxidation using chemical vapor deposition (CVD). The thick oxide film 11 is provided to alleviate an electric field. The thick oxide film 11 is formed thicker than the gate insulating film 10.

The gate electrode 9 is disposed above the P-type semiconductor substrate 2, between the N-type source region 6 and the N-type drain region 8. The gate electrode 9 is formed on the gate insulating film 10 and the thick oxide film 11. Hence, the gate electrode 9 is formed so that, of the gate electrode 9, a top face of a portion overlapping the thick oxide film 11 and of another portion continuing from the portion and overlapping the gate insulating film 10 is positioned above a top face of the rest of the gate electrode 9. Hence, the gate electrode 9 has a level difference in the intermediate portion.

The STI structure 12 is formed, through the thick oxide film 11, at least under an end portion, of the gate electrode 9, toward the N-type drain region 8. The STI structure 12 is formed in the thickness direction of the P-type semiconductor substrate 2. Moreover, the STI structure 12 is formed to be buried to a predetermined depth from the top face 2a of the P-type semiconductor substrate 2 (more specifically, from a top face of the N-type drain region 8). Furthermore, the STI structure 12 is formed in an area between: a position away from a boundary between the gate insulating film 10 and the thick oxide layer 11 slightly toward the N-type drain region 8; and an end of the N-type drain region 8. The STI structure 12 is provided to alleviate an electric field.

Note that, in this embodiment, the P-type body region 4 and the N-type source region 6 are connected together with the source electrode 6a, in order to have the same electric potential.

Here, the P-type diffusion region 3 has an end that defines the area in which the P-type diffusion region 3 extends. The end is determined by a distance L1 (a first distance) and a distance L2 (a second distance).

The distance L1 is a distance in a direction from a first reference position P1 below an end, of the P-type body region 4, toward the N-type drain region 8 to the end of the P-type diffusion region 3. The distance L1 is along the top face 2a of the P-type semiconductor substrate 2. The distance L2 is a distance in a direction from a second reference position P2 below an end, of the N-type drain region 8, toward the STI structure 12 to the end of the P-type diffusion region 3. The distance L2 is along the top face 2a of the P-type semiconductor substrate 2. The sum of the distance L1 and the distance L2 is a predetermined value.

(Operation of Semiconductor Device 1)

Here, an operation of the semiconductor device 1 is described.

When a positive electric potential with respect to the P-type body region 4 is applied to the gate electrode 9, a channel is formed between the N-type source region 6 and the N-type drift region 5. The channel is formed in a portion, of the P-type body region 4 and the P-type semiconductor substrate 2, directly below the gate electrode 9. As a result, electrons move in a route from the source electrode 6a to the drain electrode 8a through the channel. Hence, a current flows between the source electrode 6a and the drain electrode 8a.

(Improvement in Breakdown-Voltage of Semiconductor Device 1)

As to the semiconductor device 1 for a breakdown-voltage of 60 V, a simulation of a potential distribution is conducted, while a GND electric potential is provided to the source electrode 6a and the gate electrode 9, and a voltage of 60 V is applied to the drain electrode 8a. Described below is a case where the sum of the distances L1 and L2 is 3.7 μm.

Figure 2:
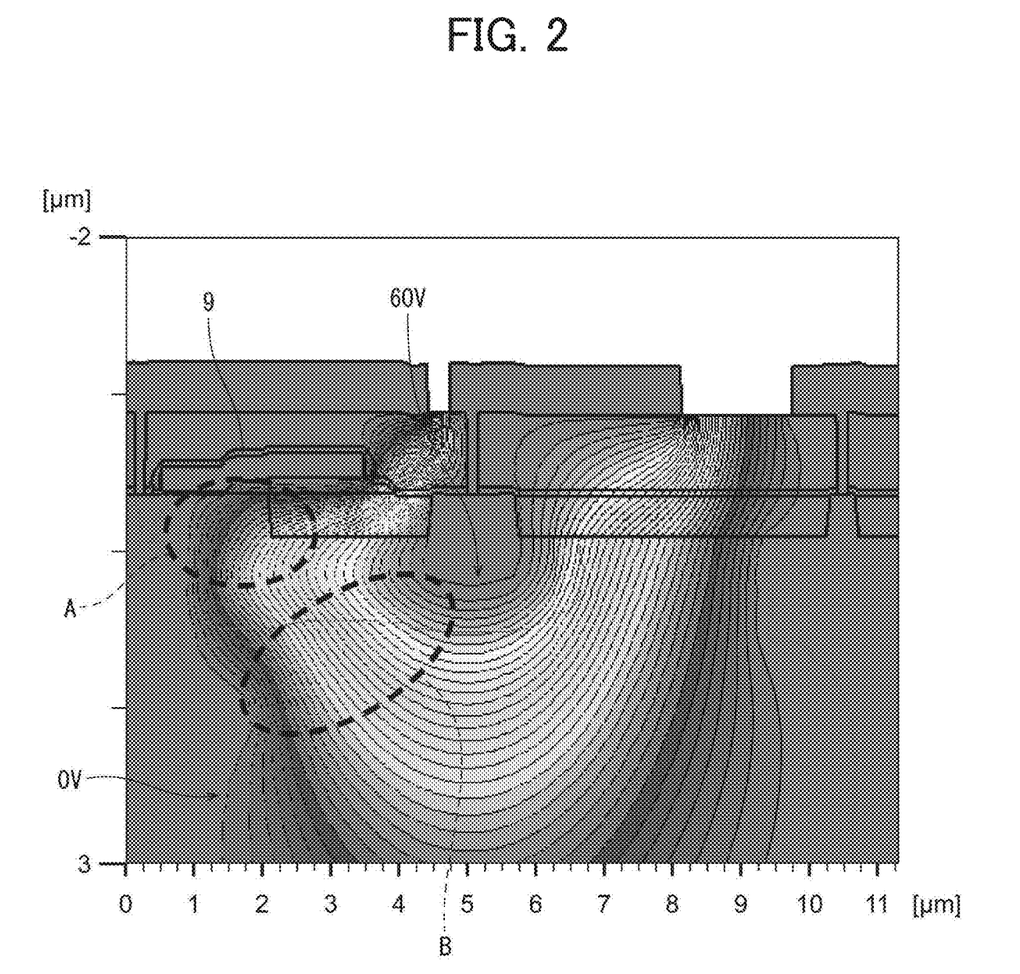
FIG. 2 is a graph showing a potential distribution in a simulation of the above semiconductor device.
Figure 3:
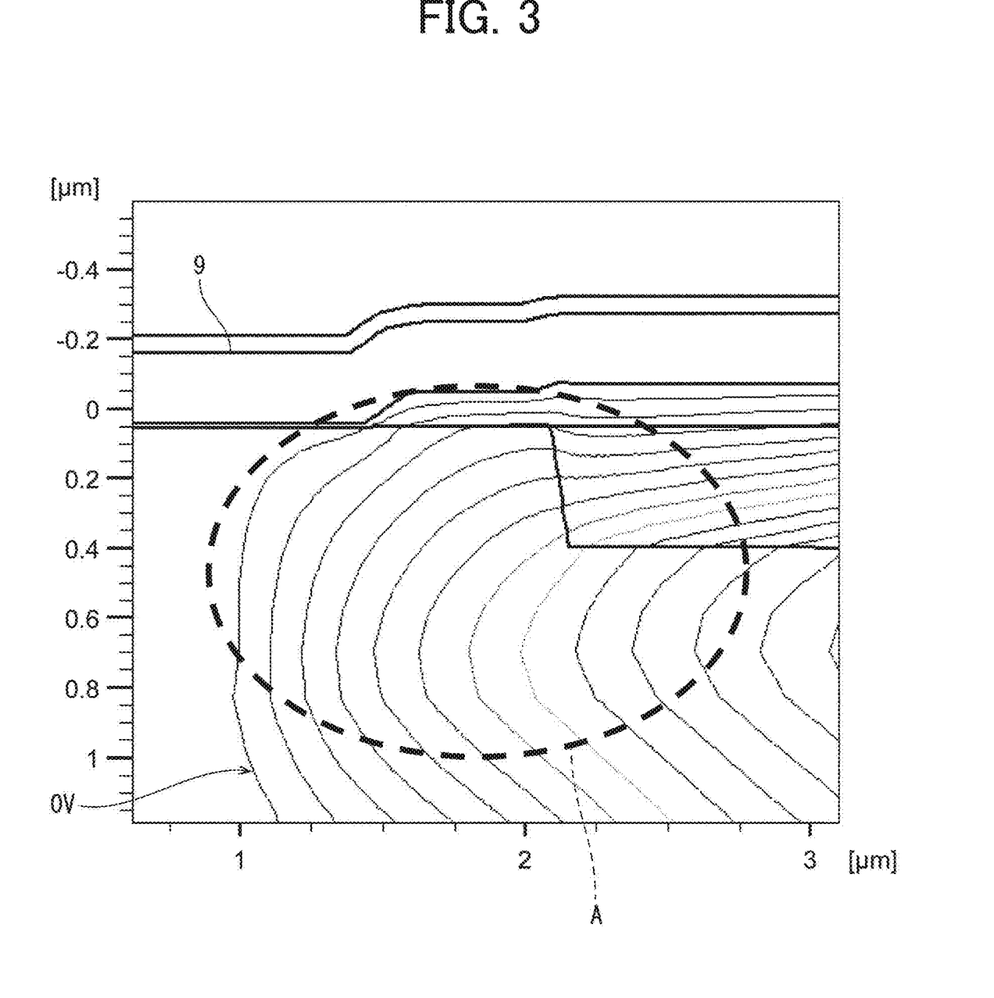
FIG. 3 is a graph enlarging the above potential distribution in a region A of FIG. 1.
Figure 4:
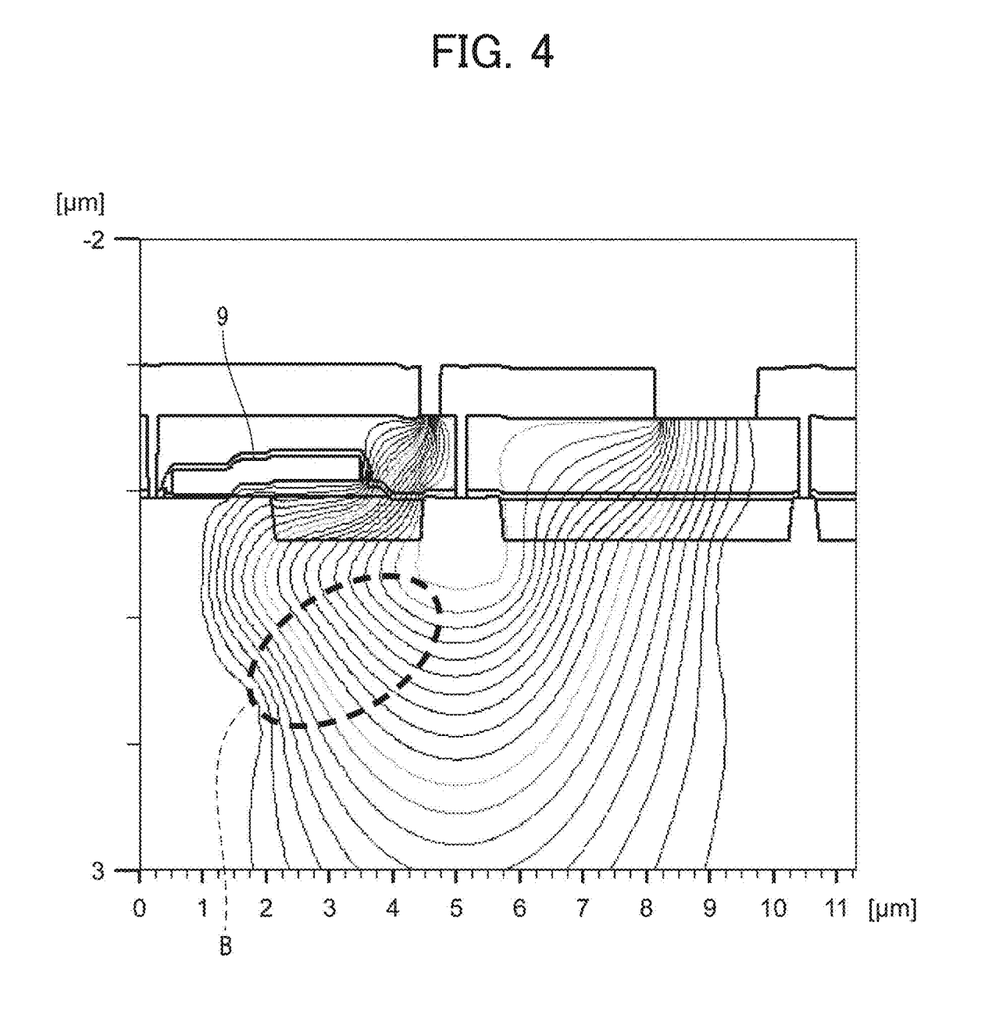
FIG. 4 is a graph enlarging the above potential distribution in a region B of FIG. 1.

FIG. 2 is a graph showing a potential distribution in a simulation of the semiconductor device 1 in a case where the distance L1 is 1.2 μm and the distance L2 is 2.5 μm. FIG. 3 is a graph enlarging the above potential distribution in a region A of FIG. 1. FIG. 4 is a graph enlarging the above potential distribution in a region B of FIG. 1.

In the case where the distance L1 is 1.2 μm and the distance L2 is 2.5 μm, FIGS. 2 and 3 show that the region A (a first region), including the end portion 5a of the N-type drift region 5, has equipotential lines spaced relatively widely, and the potential distribution in the region A is sparse. In contrast, in the case where the distance L1 is −0.3 μm and the distance L2 is 4.0 μm, although not shown, the region A has the equipotential lines spaced narrower than those in the case where the distance L1 is 1.2 μm and the distance L2 is 2.5 μm. The potential distribution in the region A is dense.

As can be seen, in the case where the distance L1 is 1.2 μm and the distance L2 is 2.5 μm, the potential distribution in the region A is relatively sparse. It shows that the concentration of the electric field is alleviated in the region A, and so is the electric field on the surface of the semiconductor device 1. This means an increase in breakdown voltage. Hence, when the distance L1 increases to some extent, an improvement in breakdown-voltage is expected in the region A. If the improvement in breakdown-voltage is sufficient, the breakdown-voltage of the semiconductor device 1 is determined not by the breakdown-voltage in the region A but by the breakdown voltage in the region B (a second region) between the end of the P-type diffusion region 3 and the N-type drain region 8 illustrated in FIG. 1.

Next, in the case where the distance L1 is 1.2 μm and the distance L2 is 2.5 μm, FIGS. 2 and 4 show that the region B has equipotential lines spaced relatively widely, and the potential distribution in the region B is sparse. In contrast, in the case where the distance L1 is 3.7 μm and the distance L2 is 0 μm, although not shown, the region B has the equipotential lines spaced narrower than those in the case where the distance L1 is 1.2 μm and the distance L2 is 2.5 μm. The potential distribution in the region B is dense.

As can be seen, in the case where the distance L1 is 1.2 μm and the distance L2 is 2.5 μm, the potential distribution in the region B is relatively sparse. It shows that the concentration of the electric field is alleviated in the region B. This means that the breakdown-voltage increases as the distance L2 increases.

In view of the improvement in the breakdown-voltage in the regions A and B, the distances L1 and L2 are appropriately set to obtain a desired breakdown-voltage.

Figure 5:
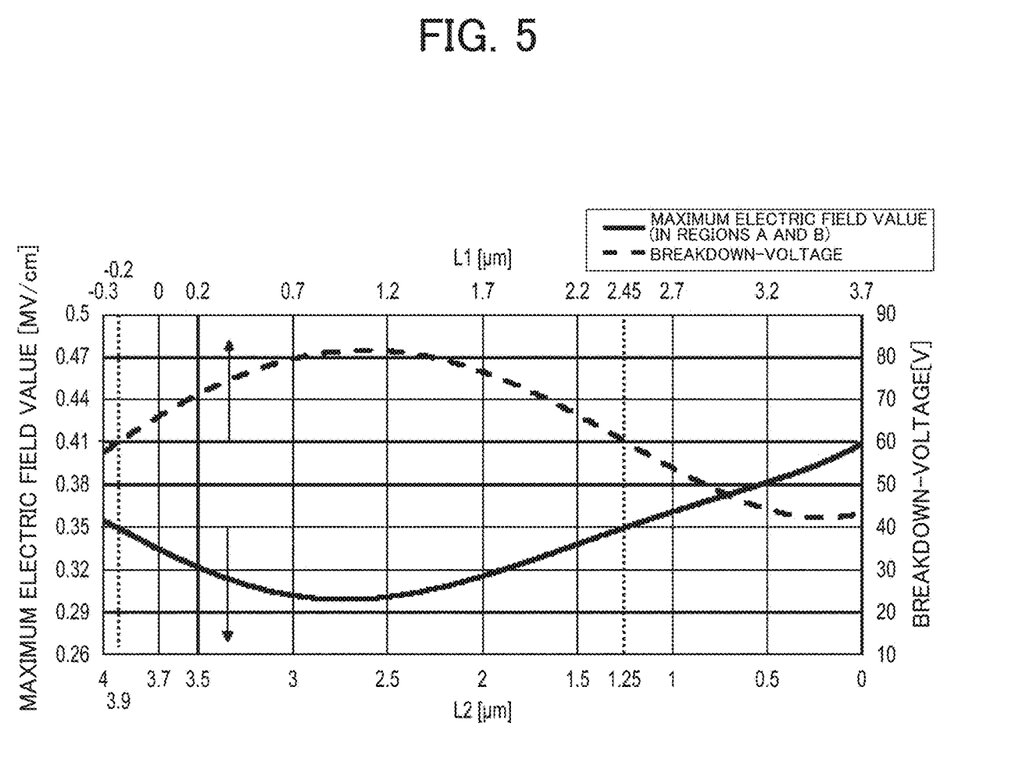
FIG. 5 is a graph illustrating a relationship between the maximum electric field value and the breakdown-voltage for two distances that define a position of an end of a P-type diffusion region in the above semiconductor device.

Described next is an improvement in breakdown-voltage observed when the distances L1 and L2 are set most appropriately. FIG. 5 is a graph illustrating a relationship between the maximum electric field value and the breakdown-voltage, in the regions A and B, for the two distances L1 and L2 that define a position of the end of the P-type diffusion region 3. In FIG. 5, the horizontal axis on the top represents the distance L1. The horizontal axis on the bottom represents the distance L2. The vertical axis on the left represents the maximum electric field value. The vertical axis on the right represents the breakdown-voltage. The sum of the values of the opposing distances L1 and L2 between the horizontal axes on the top and the bottom is 3.7 μm.

As illustrated by the solid line in FIG. 5, the maximum electric field value shows a tendency to: decrease as the distance L1 increases since the distance L1 is −0.3 μm and the distance L2 is 4 μm; become smallest when the distance L1 is 1 μm and the distance L2 is 2.7 μm; and then increase as the distance L1 increases. Meanwhile, as illustrated by the dashed line in FIG. 5, the breakdown-voltage shows a tendency to: increase as the distance L1 increases since the distance L1 is −0.3 μm and the distance L2 is 4 μm; become largest when the distance L1 is 1 μm and the distance L2 is 2.7 μm; and then decrease as the distance L1 increases.

Thanks to such a relationship between the maximum electric field value and the breakdown voltage, the breakdown-voltage is determined to reach 60 V or more among the combinations of the distances L1 and L2 in which the maximum electric field value is in a range of 0.35 MV/cm or less in the regions A and B. The combinations range from the distance L1 of −0.2 μm and the distance L2 of 3.9 μm to the distance L1 of 2.45 μm and the distance L2 of 1.25 μm. Among these combinations, the combination of the distance L1 of 1 μm and the distance L2 of 2.7 μm achieves the optimum electric field value providing the maximum breakdown-voltage.

As can be seen, in this embodiment, a combination of the distances L1 and L2 is appropriately selected and set, so that the intensity of the electric fields in the regions A and B is 0.35 MV/cm or less. This feature makes it possible to readily avoid reduction in breakdown-voltage caused by avalanche breakdown in the regions A and B, and obtain a breakdown-voltage of 60 V or more.

Note that this embodiment shall not be limited to the example described above, and may include various modifications. For example, the above semiconductor device 1 is described in detail so that an aspect of the present invention is readily understood. The semiconductor device 1 shall not necessarily be limited to the one including all the constituent features described above. For example, the conditions of the ion implantations to form the respective semiconductor layers are examples, and can be modified as appropriate.

In such a case, the sum of the most appropriate distances L1 and L2 is constant. The sum varies within a range from a combination in which the distance L1 has a lowermost value of the first distance and the distance L2 has an uppermost value of the second distance to a combination in which the distance L1 has an uppermost value of the first distance and the distance L2 has a lowermost value of the second distance. Specifically, the distances L1 and L2 vary within a range of the combinations described above as a preferred example, that is, from the combination of the distance L1 of −0.2 μm (the lowermost value of the first distance) and the distance L2 of 3.9 μm (the uppermost value of the second distance) to the combination of the distance L1 of 2.45 μm (the uppermost value of the first distance) and the distance L2 of 1.25 μm (the lowermost value of the second distance). As can be seen, the distances L1 and L2 can have values of any given combination within the above range. Hence, within the range, the most appropriate distances L1 and L2 can be selected.

Moreover, the embodiment may have a configuration partially replaced with another configuration. The embodiment may also have a configuration additionally including another configuration. Furthermore, the embodiment have a configuration that can be partially subjected to any one of the following; that is, additionally including another configuration, deleted, or replaced with another configuration. As such an example, the semiconductor device 1 of this embodiment does not have to be limited to an N-channel LDMOS transistor. The semiconductor device 1 may also be a P-channel LDMOS transistor. Moreover, the target breakdown-voltage of a target device shall not be limited to a particular breakdown-voltage. The lateral size of each of the constituent features, including the distances L1 and L2, shall not be limited to a particular size. Furthermore, in the semiconductor device 1, such a feature as a lightly doped drain (LDD) implantation may be additionally included to form another transistor.

In addition, the semiconductor device 1 (the N-channel LDMOS transistor) of this embodiment is formed on the P-type semiconductor substrate 2. This P-type semiconductor substrate 2 may be a P-type semiconductor region formed on an N-type epitaxially-buried layer. In such a case, the source electrode and the P-type semiconductor region can be set to have an electric potential different from that of the P-type semiconductor substrate provided through the N-type epitaxially-buried layer. This is a case where the semiconductor device 1 is assumed to operate as a high-side switch. The breakdown voltage in such a case is defined by a difference in electric potential between the drain electrode and the source electrode.

Moreover, this embodiment is assumed to provide an advantageous effect of an aspect of the present invention to an N-channel LDMOS transistor in an N-type diffusion region as described in the Japanese Unexamined Patent Application Publication No. 2009-059949.

The thick oxide film 11 is disposed closer to the N-type source region 6 than to the STI structure 12. This structure varies the distribution of the electric field in the region A, and increases the breakdown-voltage.

SUMMARY

The semiconductor device 1 according to a first aspect of the present invention includes: a semiconductor substrate of a first conductivity type; a body region of the first conductivity type, the body region being formed in a surface layer of the semiconductor substrate; a source region of a second conductivity type, the source region being formed in contact with the body region; a drain region of the second conductivity type, the drain region being formed away from the body region; a gate electrode formed between the source region and the drain region; a drift region of the second conductivity type, the drift region being formed in contact with the drain region in the surface layer of the semiconductor substrate, and the drift region having an end portion between the body region and the drain region; a buried oxide layer provided at least under an end portion, of the gate electrode, toward the drain region, the buried oxide layer being formed to be buried from a top face of the semiconductor substrate, and the buried oxide layer being configured to alleviate an electric field; and a semiconductor region of the first conductivity type, the semiconductor region being formed in a position deeper than the body region in order to have contact with a bottom face of the body region, wherein, the semiconductor region is formed to extend in a direction along the top face of the semiconductor substrate, a first distance is in a direction from a first reference position below an end, of the body region, toward the drain region to an end of the semiconductor region, the first distance being along the top face of the semiconductor substrate, a second distance is in a direction from a second reference position below an end, of the drain region, toward the buried oxide layer to the end of the semiconductor region, the second distance being along the top face of the semiconductor substrate, and the first distance and the second distance are set so that an intensity of 0.35 MV/cm or less is observed in an electric field of a first region including the end portion of the drift region and in an electric field of a second region between the end of the semiconductor region and the drain region.

Thanks to above configuration, a breakdown-voltage of a desired voltage or more can be obtained when the intensity of the electric fields in the first region and the second region is alleviated to 0.35 MV/cm or less.

In the semiconductor device, of a second aspect of the present invention, according to the first aspect, the drift region may be positioned closer to the top face of the semiconductor substrate than to the semiconductor region.

Thanks to the above configuration, the semiconductor region and the drift region, both of which are high in concentration, can be kept from contact with each other.

In the semiconductor device, of a third aspect of the present invention, according to the first or second aspect, a sum of the first distance and the second distance may be constant, and the sum may be allowed to have a value within a range from a combination in which the first distance has a lowermost value of the first distance and the second distance has an uppermost value of the second distance to a combination in which the first distance has an uppermost value of the first distance and the second distance has a lowermost value of the second distance.

Thanks to the above configuration, the most suitable combination of the first distance and the second distance can be selected in the range.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A semiconductor device, comprising:
a semiconductor substrate of a first conductivity type;
a body region of the first conductivity type, the body region being formed in a surface layer of the semiconductor substrate;
a source region of a second conductivity type, the source region being formed in contact with the body region;
a drain region of the second conductivity type, the drain region being formed away from the body region;
a gate electrode formed between the source region and the drain region;
a drift region of the second conductivity type, the drift region being formed in contact with the drain region in the surface layer of the semiconductor substrate, and the drift region having an end portion between the body region and the drain region;
a buried oxide layer provided at least under an end portion, of the gate electrode, toward the drain region, the buried oxide layer being formed to be buried from a top face of the semiconductor substrate, and the buried oxide layer being configured to alleviate an electric field; and
a semiconductor region of the first conductivity type, the semiconductor region being formed in a position deeper than the body region in order to have contact with a bottom face of the body region,
wherein, the semiconductor region is formed to extend in a direction along the top face of the semiconductor substrate,
a first distance is in a direction from a first reference position below an end, of the body region, toward the drain region to an end of the semiconductor region, the first distance being along the top face of the semiconductor substrate,
a second distance is in a direction from a second reference position below an end, of the drain region, toward the buried oxide layer to the end of the semiconductor region, the second distance being along the top face of the semiconductor substrate, and
the first distance and the second distance are set so that an intensity of 0.35 MV/cm or less is observed in an electric field of a first region including the end portion of the drift region and in an electric field of a second region between the end of the semiconductor region and the drain region.

2. The semiconductor device according to claim 1,
wherein the drift region is positioned closer to the top face of the semiconductor substrate than to the semiconductor region.

3. The semiconductor device according to claim 1,
wherein a sum of the first distance and the second distance is constant, and the sum is allowed to have a value within a range from a combination in which the first distance has a lowermost value of the first distance and the second distance has an uppermost value of the second distance to a combination in which the first distance has an uppermost value of the first distance and the second distance has a lowermost value of the second distance.

\* \* \* \* \*